United States Patent

Kondo

[15] 3,668,551

[45] June 6, 1972

[54] SOLID STATE MICROWAVE OSCILLATOR WITH CERAMIC CAPACITANCE TEMPERATURE COMPENSATING ELEMENT

[72] Inventor: Akihiro Kondo, Itami, Japan

[73] Assignee: Mitsubishi Denki Kabushiki Kaisha, Tokyo, Japan

[22] Filed: Nov. 2, 1970

[21] Appl. No.: 86,141

[30] Foreign Application Priority Data

Nov. 4, 1969 Japan....................................44/88307
Sept. 10, 1970 Japan....................................45/79486

[52] U.S. Cl...................................331/96, 317/247, 317/258, 331/107 R, 331/107 G, 331/176, 333/83 T
[51] Int. Cl...........................................H03b 3/04, H03b 7/14
[58] Field of Search..............331/96, 97, 107 R, 107 G, 109, 331/176; 333/82 BT, 83 T; 317/258, 259, 247

[56] References Cited

UNITED STATES PATENTS 3,443,244 5/1969 Cook.................................331/107 X
3,480,889 11/1969 Kach....................................333/83 T
2,779,004 1/1957 Bredall et al. .....................333/83 T X
2,155,835 4/1939 McCreery et al..................317/258 X
3,400,001 9/1968 Hasumi et al. ......................317/258 X

OTHER PUBLICATIONS

Clarke et al., " Gunn-Diode Operation At Q Band Frequencies," Electronics Letters, Nov. 1, 1968, Vol. 4, No. 22, pp. 482–483.

*Primary Examiner*—Roy Lake
*Assistant Examiner*—Siegfried H. Grimm
*Attorney*—Robert E. Burns and Emmanuel J. Lobato

[57] ABSTRACT

An enclosed Gunn effect diode is disposed within a microwave resonant cavity. A capacitive element of dielectric ceramic such as titanium oxide having a negative temperature coefficient of capacitance is attached to the insulating portion of the enclosure for the diode. Alternatively the enclosure for the diode may be partly or entirely formed of such a dielectric ceramic.

13 Claims, 6 Drawing Figures b & b': WITH TEMPERATURE COMPENSATION
a & a': WITHOUT TEMPERATURE COMPENSATION

SOLID STATE MICROWAVE OSCILLATOR WITH CERAMIC CAPACITANCE TEMPERATURE COMPENSATING ELEMENT

BACKGROUND OF THE INVENTION

This invention relates to a solid state microwave oscillator with a ceramic capacitance temperature compensating element and more particularly to a frequency stabilizer for use with a solid state microwave oscillator such as a Gunn effect oscillator or an avalanche-transit time effect oscillator to stabilize the oscillation frequency thereof against a change in temperature thereof.

Semiconductor microwave oscillators utilizing the Gunn effect and the bulk effect or the IMPATT effect are very promising as microwave sources because of their small size and convenience. The IMPATT effect is that in PN junction semiconductors having applied thereacross a high biasing voltage, the cumulative multiplication of carriers through the carrier avalanche in the PN junction cooperates with the transit time effects of the carriers produced therethrough to produce negative resistance and cause an oscillation. The IMPATT effect is often called the avalanche-transit time effect. However those microwave oscillators have operating characteristics essentially high in temperature dependency because they utilize semiconductors. Also the metallic components involved can expand in response to a temperature rise to increase the volume of the associated resonant cavity. This is accompanied by a change in oscillation frequency which is, in turn, coupled with operating characteristic high in temperature dependency resulting in the necessity of providing means for stabilizing the oscillation frequency for all practical purpose.

As well known, Gunn effect diodes or bulk effect diodes and IMPATT effect diodes utilize the transit time of carriers or domains. However, an increase in temperature causes the carriers to decrease in saturation velocity thereby to increase the transit time thereof. Consequently the diodes decrease in oscillation frequency. In IMPATT effect diodes a change in temperature of carriers produced through the avalanche effect is also one of the factors affecting the oscillation frequency. That is, an increase in temperature of the carriers tends to aid in decreasing the oscillation frequency. Another factor for decreasing the oscillation frequency with a rise of temperature is the thermal expansion of metallic components involved to increase the dimension of the associated resonant cavity as above described.

In order to prevent the oscillation frequency from varying due to a change in temperature, there have been previously proposed and practiced numerous attempts. For example, a mechanical one of such attempts has been to form the particular resonant cavity of at least two metallic materials different in coefficient of thermal expansion from each other to decrease the volume of the resonant cavity in response to an increase in its temperature thereby to prevent a decrease in oscillation frequency. Also automatic frequency control (AFC) loops have been used in which a part of the oscillatory signal from the associated socillation circuit is sampled and compared with a reference signal to sense a difference in frequency therebetween and to feed back a compensation voltage to the oscillator circuit for the stabilization of the oscillation frequency. Further the injection synchronization has been already known whereby a source of signal stabilized in frequency is externally applied to the oscillator for stabilization purpose. While numerous measures of stabilizing the oscillation frequency are presently being studies, there has been proposed the addition of high-Q resonant cavities. This is because an increase in Q causes the oscillation frequency to be correspondingly stabilized.

All the attempts and measures as above described have rendered the resulting oscillators considerably expensive, complicated in construction and decreased in merit in the sense of the direct oscillation which is a great cause for inhibiting the extension of their practical use. Further the conventional type of solid state microwave oscillators though they have been well designed might have a fluctuation of 100 kilohertzs per degree centigrade of the actual frequency from the designed frequency.

SUMMARY OF THE INVENTION

Accordingly it is an object of the invention to highly stabilize an oscillation frequency produced from a solid state microwave oscillator such as a Gunn effect oscillator or an avalanche-transit time effect oscillator against a change in temperature.

It is another object of the invention to provide a new and improved frequency stabilization device for a solid state microwave oscillator which is very simple in construction, small in dimension and high in practical value as compared with the known temperature compensations using a capacitance variable diode and utilizing differences in coefficient of thermal expansion between materials involved.

It is still another object of the invention to provide a new and improved solid state microwave oscillator simple in construction and inexpensive as well as producing an oscillation frequency highly stabilized against a change in temperature.

The invention accomplishes these objects by the provision of a frequency stabilization device for a solid state microwave oscillator comprising a semiconductor microwave oscillation element, and a resonant cavity having the semiconductor microwave oscillation element disposed therein, characterized by a capacitive element attached to or forming part of an enclosure for the oscillation element; such a that the capacitive element interacts on an electromagnetic wave produced in the resonant cavity, the capacitive element having a negative temperature coefficient of a change in capacitance due to its temperature.

The oscillator element may be advantageously of the Gunn effect type or the avalanche-transit time effect type.

The capacitive element may be advantageously of a dielectric ceramic material selected from the group consisting of titanium oxide and magnesium titanate porcelains.

The capacitive element may be conveniently attached to an enclosure for the oscillation element. Alternatively it may form a part of the enclosure for the oscillation element.

BRIEF DESCRIPTION OF THE DRAWINGS

The invention will become more readily apparent from the following detailed description taken in conjunction with the accompanying drawings in which.

DESCRIPTION OF THE PREFERRED EMBODIMENTS

Figure 1:
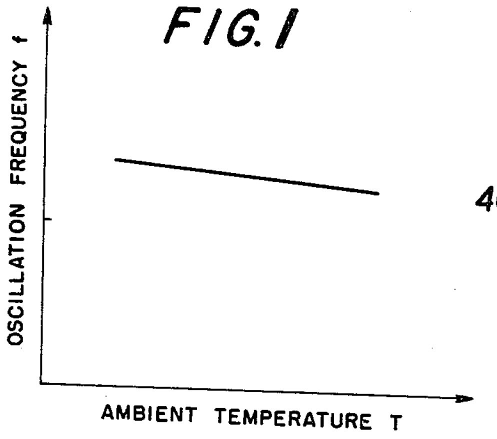
FIG. 1 is a graphic representation of the general temperature characteristic of the oscillation frequency produced by solid state microwave oscillators.
Figure 2:
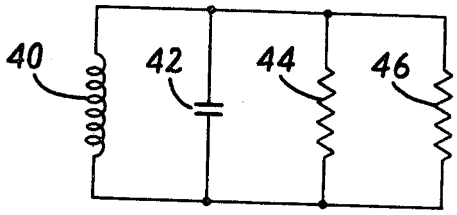
FIG. 2 is a diagram of an equivalent circuit to a typical solid state microwave oscillator having the temperature characteristic shown in FIG. 1.

For a better understanding of the invention, solid state microwave oscillators will now be described in terms of the temperature dependency of the oscillation frequency. FIG. 1 shows a curve plotting an oscillation frequency $f$ (in ordinate) against the ambient temperature T (in abscissa). As shown in FIG. 1, the oscillation frequency generally decreases as a linear function of the temperature. This is the basis upon which the mechanically tuning mechanism as previously employed accomplishes the temperature compensation. From FIG. 1 it will be understood that solid state microwave oscillators can have the equivalent circuit such as shown in FIG. 2. In FIG. 2, an equivalent oscillation circuit is formed of an equivalent inductance 40, a capacitance 42 of an enclosure for an oscillator diode involved, a negative conductance 44 of the diode and a conductance 46 of the particular load interconnected in parallel circuit relationship.

Where oscillation circuits are of such an LC resonance type, the enclosure for the oscillation diode has a capacitance C not so much changed with temperature because it is usually formed of ceramic alumina while the equivalent inductance L rectilinearly increases with a temperature. Therefore the oscillation circuit exhibits the temperature characteristic of the oscillation frequency as shown in FIG. 1. Accordingly it can be concluded that if the enclosure for the diode behaves such that its capacitance decreases with an increase in temperature that this decrease in capacitance offsets a decrease in oscillation frequency due to an increase in equivalent inductance with the result that a change in oscillation frequency due to a variation in temperature can be eliminated. This is the fundamental principle of the invention. It has been found that dielectric ceramic materials of titanium oxide system are preferably used in practicing the invention. Such dielectric ceramic materials have capacitances rectilinearly and reversibly varied with temperature and having any temperature coefficient. Some of titanium oxide system dielectric ceramic materials may have negative temperature coefficients of change in capacitance amounting to several thousand parts per million. Thus it is possible to select any desired temperature coefficient over a relatively wide range.

For example, titanium oxide ceramic is one of the titanium oxide system dielectric ceramic materials and essentially formed of titanium oxide having added thereto one or more of various metal oxides. Those materials thoroughly mixed together are fired in a furnace at about 1,300° C. to form the desired ceramic. The ceramic thus formed has a capacitance rectilinearly and reversibly variable in response to a change in temperature as above described. Further the capacitance can have a temperature coefficient whose value may become positive or negative by suitably selecting the type of starting materials added to titanium oxide and/or adjusting amounts thereof. It has been also found that magnesium titanate ceramic can be equally used with the invention. This ceramic has a temperature coefficient of capacitance the value of which can be also rendered positive or negative as desired.

Figure 3:
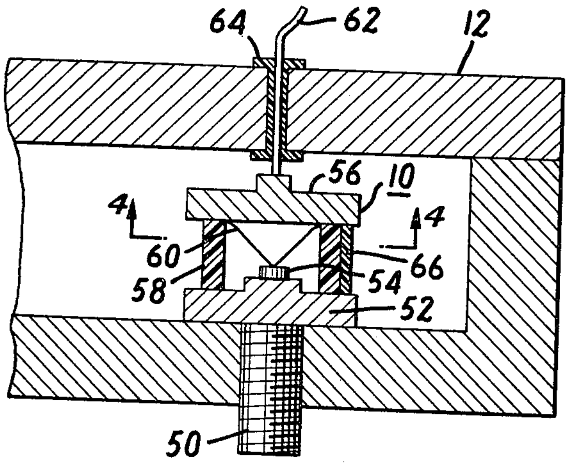
FIG. 3 is a fragmental sectional view of a frequency stabilization device for a solid state microwave oscillator constructed in accordance with the principles of the invention.
Figure 4:
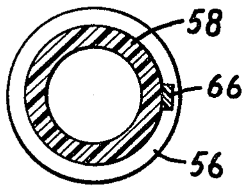
FIG. 4 is a sectional view taken along the line 4—4 of FIG. 3.

Referring now to FIGS. 3 and 4, there is illustrated a frequency stabilization device for a solid state microwave oscillator constructed in accordance with the principles of the invention. The arrangement illustrated comprises an oscillation element generally designated by the reference numeral 10 and fixedly secured to one wall of a resonant cavity 12 by having a screw 50 screw threaded into the one wall of the resonant cavity 12 and secured to a base block 52 formed preferably of copper. The base block 52 includes a lower surface resting on the wall of the resonant cavity and an upper surface on which is disposed a semiconductor diode chip 54 such as a Gunn effect diode chip of gallium arsenide (GaAs). If desired diode may be of the IMPATT effect type. Thus the base block 52 serves as a lower electrode for the diode 54. Disposed above the diode chip 54 is an upper electrode 56 formed preferably of any suitable metallic material such as Kovar (trade mark) while a ceramic insulation 58 in the form of a hollow cylinder is sandwiched between the lower and upper electrodes 52 and 56 for the purpose of maintaining both electrodes in a predetermined spaced parallel relationship and also electrically insulating them from each other. Thus it will be seen that the semiconductor diode chip 54 is hermetically disposed in place within an enclosure formed of the electrodes 52 and 56 and the cylindrical insulation 58. The diode chip 54 is connected to the upper electrode 56 through two lengths of gold wire 60. The upper electrode 56 is then connected to a lead 62 extending through the upper wall as viewed in FIG. 3 of the resonant cavity 12 with an insulation 64 interposed between the lead 62 and the adjacent portion of the upper cavity wall.

According to the principles of the invention, a capacitive element 66 in the form of a strip is attached to the outer periphery of the hollow insulation 58 forming a part of the enclosure for the oscillation element 10 and extends between the electrodes 52 and 56. The capacitive element 66 is of any suitable dielectric ceramic material such as above described, in this case, titanium oxide and serves to impart a negative temperature coefficient to the package capacitance. The capacitive element 66 as shown in FIGS. 3 and 4 was 0.8 millimeter long, 100 micron thick and 200 microns wide while the insulation 58 had a height of 0.8 millimeter, an outside diameter of 4 millimeters and a thickness of 1 millimeter. However it is to be understood that the dimension of the capacitive element 66 should not be restricted to the above figures and that it may be changed in accordance with the associated enclosure.

Solid state microwave oscillators operative in the X-band of frequencies, such as shown in FIGS. 3 and 4 were produced and the oscillation frequencies thereof were measured in a temperature range of from about −40° to +55° C. One result of the measurements is illustrated in FIG. 5 wherein the axis of abscissas represent temperature in a change in oscillation output in milliwatts on the upper portion and; degrees centigrade and the axis of ordinates represents a change in oscillation frequency graduated in 10 megahertz on the lower portion.

Figure 5:
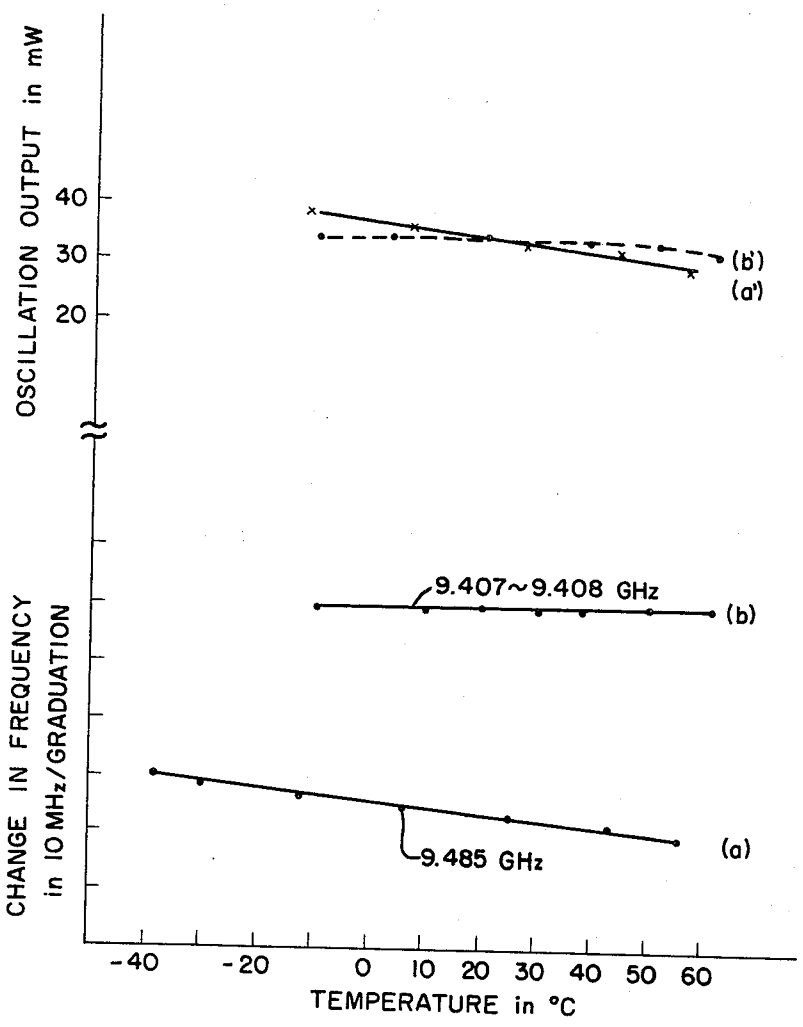
FIG. 5 is a graphic representation of an oscillation frequency and an oscillation output plotted against a temperature for a microwave oscillator when stabilized in frequency according to the principles of the invention and when not stabilized in frequency.

From FIG. 5 it is seen that with no temperature compensation effected, that is with the capacitive element 66 not used, the oscillation frequency changed by −100 kilohertz per degree centigrade between about −40° and +55° C. as shown at curve (*a*). At about +6° C. the oscillation frequency was of 9.485 gigahertz . However with the enclosure for the diode having attached thereto a capacitive element having a negative temperature coefficient of capacitance, the oscillation frequency changed only by +30 kilohertz per degree centigrade between about −9° and +61° C. with the oscillation frequency ranging from 9.407 to 9.408 gigahertz as shown at curve (*b*) in FIG. 5.

FIG. 5 also shows curves plotting the oscillation output power in milliwatts against the temperature in degrees centigrade. Solid curve (*a'*) describes the oscillator having the temperature characteristic as shown at curve (*a*), that is, including no capacitive element of the invention, and dotted curve (*b'*) describes the oscillator having the temperature characteristic as shown at curve (*b*), that is, including the temperature compensation element of the invention. It will be seen that a difference in output power is relatively small between both oscillators. This is believed to result from the fact that the capacitive element is much smaller than the associated enclosure and therefore a power loss due to the insertion of the element is insignificant. In addition, materials for the capacitive element have dielectric loss angle $\delta$ whose tangents are frequently in the order of $10^{-4}$ at frequencies of the X-band as will readily be understood from their properties.

Figure 6:
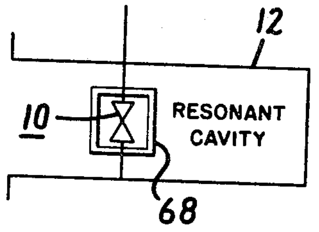
FIG. 6 is a diagrammatic view of a modification of the invention.

FIG. 6 wherein like reference numerals designate the components identical or corresponding to those shown in FIG. 3 illustrates a modification of the invention.

In FIG. 6, any dielectric ceramic suitable for use as the materials for the capacitive element forms an enclosure 68 for the oscillation diode 10. This measure permits the temperature compensation to be accomplished by the single diode. If desired, only one portion of the enclosure may be effectively of such a dielectric ceramic. In any event, what is essential is to dispose the capacitive element within the resonant cavity in association with the diode enclosure to interact on an electromagnetic wave produce in the cavity.

The invention has several advantages. For example, the resulting frequency stabilization device is allowed to have the performance equal to that exhibited by the temperature compensation utilizing the mechanically tuning mechanism previously employed, and without the necessity of machining any metallic portion of the associated resonant cavity as will readily be apparent from its construction. Also it is passively operated and high in reliability. An oscillator diode involved itself can compensate for a change in oscillation frequency due to a variation in temperature of the resonant cavity. Further, by properly controlling the capacitance and the temperature coefficient thereof of the compensating capacitive element, any desired degree of temperature compensation is possible to be obtained. In addition, as compared with the prior art practice, the invention is very convenient and the dimension comes scarcely into question as well as being very cheap.

What is claimed is:

1. A solid state microwave oscillator comprising a resonant cavity, a semiconductor microwave oscillation unit disposed in said cavity and comprising spaced electrodes, a hollow enclosure of insulating material extending between said electrodes and an oscillation element within said enclosure, and a ceramic capacitative temperature compensating element associated with said enclosure, said capacitative element having a selected negative temperature coefficient.

2. A solid state microwave oscillator according to claim 1, wherein said enclosure comprises a tubular element of insulating material and said capacitative element comprises a ceramic element extending along a wall of said tubular element between said electrodes.

3. A solid state microwave oscillator according to claim 1, wherein said capacitative element forms at least part of said hollow enclosure extending between said electrodes.

4. A solid state microwave oscillator according to claim 1, wherein said solid state microwave oscillation element is a Gunn effect diode.

5. A solid state microwave oscillator according to claim 1, wherein said solid state microwave oscillation element is an avalanche-transit time effect diode.

6. A solid state microwave oscillator according to claim 1, wherein said capacitative element is of a titanium oxide ceramic material.

7. A solid state microwave oscillator according to claim 1, wherein said capacitative element is of a magnesium titanate ceramic material.

8. A solid state microwave oscillator comprising a resonant cavity, a semiconductor microwave oscillation unit disposed in said cavity and comprising spaced electrodes, a hollow enclosure of insulating material extending between said electrodes and an oscillation element within said enclosure, and a ceramic capacitance temperature compensating element extending along a wall of said enclosure between said electrodes, said capacitative element having a selected negative temperature coefficient to compensate for changes of temperature of said oscillator.

9. A solid state microwave oscillator according to claim 8, wherein said capacitative element is a strip of titanium oxide ceramic material.

10. A solid state microwave oscillator according to claim 8, wherein said capacitative element is a strip of magnesium titanate ceramic material.

11. A solid state microwave oscillator comprising a resonant cavity, a semiconductor microwave oscillation unit disposed in said cavity and comprising spaced electrodes, a hollow cylindrical enclosure of dielectric material extending between said electrodes and an oscillation element within said enclosure, said enclosure being formed at least in part of ceramic material constituting a ceramic capacitative temperature compensating element having a selected negative temperature coefficient to compensate for changes of temperature of said oscillator.

12. A solid state microwave oscillator according to claim 11, wherein said enclosure is formed in part of a titanium oxide ceramic material.

13. A solid state microwave oscillator according to claim 11, wherein said enclosure is formed in part of magnesium titanate ceramic material.

* * * * *